(12) United States Patent
Eisenson

(10) Patent No.: US 7,295,129 B2
(45) Date of Patent: Nov. 13, 2007

(54) BATTERY OPERATED DEVICE WITH A BATTERY LIFE INDICATOR

(76) Inventor: Henry Lon Eisenson, 6106 Via Regla, San Diego, CA (US) 92122

(*) Notice: Subject to any disclaimer, the term of this patent is extended or adjusted under 35 U.S.C. 154(b) by 21 days.

(21) Appl. No.: 11/401,755

(22) Filed: Apr. 11, 2006

(65) Prior Publication Data

US 2006/0239003 A1   Oct. 26, 2006

Related U.S. Application Data

(60) Provisional application No. 60/673,075, filed on Apr. 20, 2005.

(51) Int. Cl.
   *G08B 21/00*   (2006.01)

(52) U.S. Cl. .............. 340/636.1; 340/636.19; 340/7.32; 320/132; 320/133

(58) Field of Classification Search .......... 340/636.1, 340/636.12–636.15, 636.2, 636.19, 7.51, 340/7.32, 7.55; 362/253; 320/132, 133, 320/130
See application file for complete search history.

(56) References Cited

U.S. PATENT DOCUMENTS

| | | | | |
|---|---|---|---|---|
| 4,876,632 | A * | 10/1989 | Osterhout et al. | 362/183 |
| 4,962,347 | A * | 10/1990 | Burroughs et al. | 320/114 |
| 5,216,371 | A * | 6/1993 | Nagai | 324/428 |
| 6,064,183 | A * | 5/2000 | Akizuki et al. | 320/132 |
| 6,405,062 | B1 * | 6/2002 | Izaki | 455/573 |
| 6,870,349 | B2 * | 3/2005 | Cook | 320/132 |
| 6,995,543 | B2 * | 2/2006 | Nunomaki et al. | 320/132 |
| 7,110,896 | B2 * | 9/2006 | Lamer et al. | 702/63 |
| 7,123,155 | B2 * | 10/2006 | Schinner | 340/636.1 |

* cited by examiner

*Primary Examiner*—Brent A. Swarthout

(57) ABSTRACT

A countdown timer for high performance flashlights and similar battery-operated devices that is initialized with a runtime figure equal to the life expectancy of installed linear depletion-curve cells, that is always on and visible, that counts down whenever the flashlight is switched to the ON position, and that displays time remaining until the installed cells/charge are depleted, thus permitting the user to see at a glance the approximate runtime remaining on the installed power supply.

17 Claims, 5 Drawing Sheets

Fig 2.
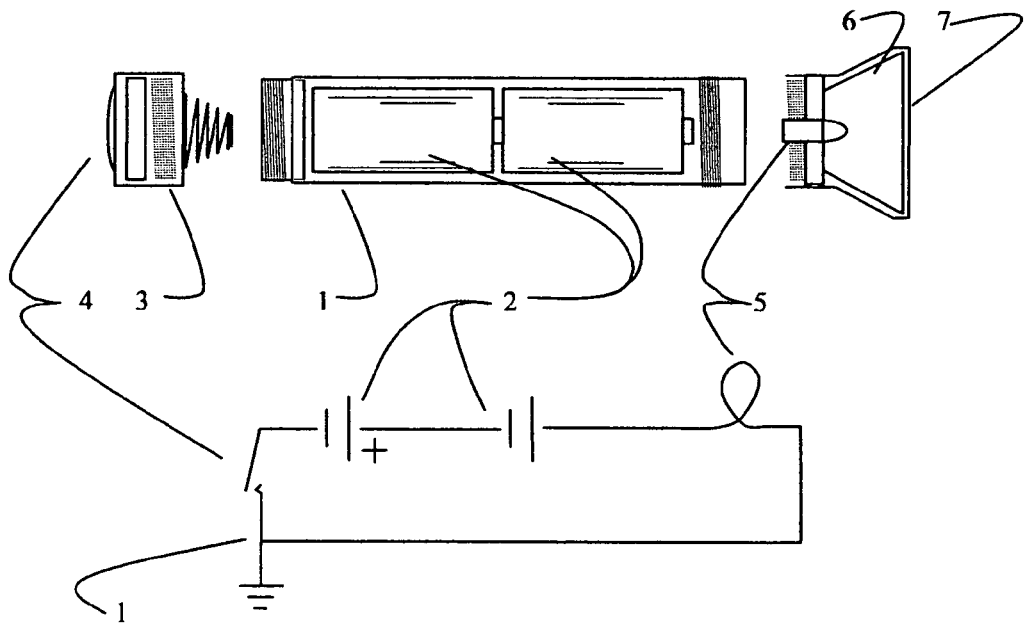
Fig 3.
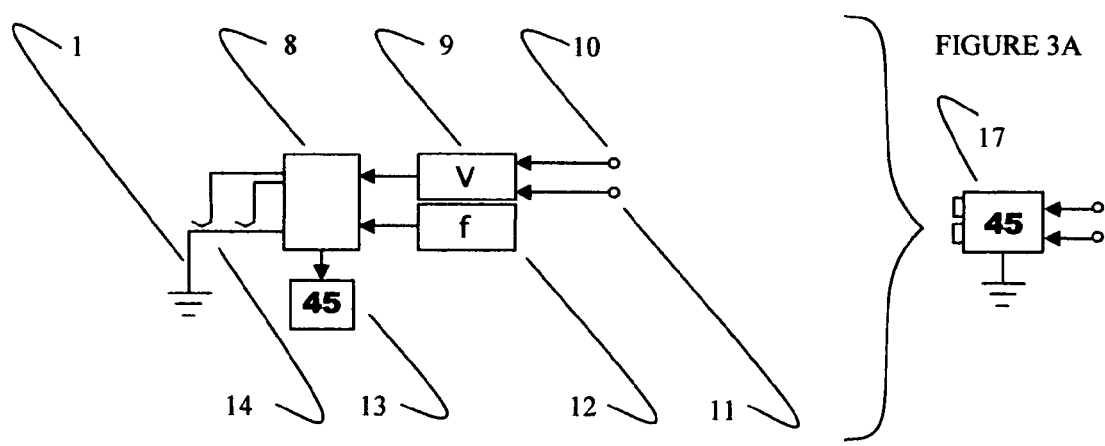
FIGURE 3A

DC charge current

DC with code showing state of charge

BATTERY OPERATED DEVICE WITH A BATTERY LIFE INDICATOR

CROSS REFERENCE TO RELATED APPLICATIONS

The present application claims the benefit of priority of U.S. Provisional Patent Application No. 60/673,075 filed Apr. 20, 2005 for Henry Lon Eisenson the entire content of which is incorporated herein by reference.

FIELD OF THE INVENTION

The present invention relates generally to the field of battery-operated flashlights, in which batteries are used to power incandescent or light-emitting diode (LED) portable light sources. It relates not to common consumer flashlights that use carbon-zinc or alkaline cells, but specifically to flashlights that utilize batteries and/or regulation with relatively flat output curves during their useful output period. The present invention is time-based: it provides an ongoing comparison between predicted battery runtime and actual usage of the flashlight, and displays the result to inform the user of minutes remaining.

BACKGROUND OF THE INVENTION

There exist several methodologies by which flashlight battery power can be determined and displayed to the user.

Prior art as shown at the U.S. Patent Office. A simple Boolean search term of abst/(flashlight and battery and (indicator or life)) elicited two meaningful results: U.S. Pat. No. 4,962,347—Flashlight with battery tester and U.S. Pat. No. 4,876,632—Flashlight with battery life indicator module.

Both of these approaches to the problem are conventional and utilize some derivative of Ohm's Law; they impose some load upon the battery, measure current flow through that load or voltage across the battery, and from those data (load and either current or voltage) estimate the battery's probable remaining capacity. These patents were evaluated and found to reflect none of the features and capabilities of the present invention.

There are many other battery-powered portable devices that do include battery life indicators of varying types, but in a market search none was found that operates on the principles set forth herein, and none was found that cost-effectively solves the portable flashlight requirement addressed by the present invention.

There are many existing designs, products, and patents that in some ways are related to the present invention, or that in some ways attempt to solve the problem addressed by the present invention, but no reasonable combination of the terms that would reasonably discover the present invention, and no search in applicable markets, have identified a similar solution.

The term "flashlight" applies to a spectrum of handheld portable lighting products ranging from simple household convenience and safety devices to those designed to meet urgent and often emergency requirements. Some flashlight products sell for the equivalent of 30 minutes' work at minimum wage, while others cost the equivalent of an hour of a competent attorney's time, and a few exotic flashlights cost thousands of dollars.

All portable "flashlights" are powered by batteries, ranging from primitive carbon-zinc cells to cells using expensive rechargeable (nickel-metal-hydride, nickel cadmium, lead acid, lithium-ion, lithium-polymer, etc.) technologies. The best non-rechargeable flashlights use lithium-ion cells with excellent power densities, usually intended for use by law enforcement, military, and emergency services personnel, but also bought by consumers willing to pay high prices for quality and performance. Makers of such lights include Streamlight, Surefire, and Pelican.

Despite at least two patents describing methodologies by which the power remaining in a flashlight's battery can be measured and displayed, there are virtually no flashlights sold today with any sort of battery life indicator. The reason is that the prior art solutions work on battery technologies that suffer a steady decline in output voltage under load, and such voltage-under-load is an unreliable predictor of remaining life.

Existing technologies by which battery life is measured impose a temporary load on the battery and measure voltage under that load, however this practice dissipates battery power into that load and therefore the remaining life is diminished by the battery power expended in the measurement process itself.

Further, inexpensive flashlights are not designed for emergency use, and therefore compete based upon price. They use inexpensive batteries that fit the profile for which such a prior art solution was designed, but the inclusion of such a feature will raise the price of this category of product beyond the range of the market.

The expensive flashlights that are designed for emergency or tactical use employ expensive batteries (i.e. lithium-ion) and/or regulation, such that the output of the power system is relatively constant until just before the battery supply is completely depleted, at which time it dies quickly. If the prior art solutions (measuring voltage under load) were to be applied to this type of flashlight, they would show maximum remaining battery life even if the flashlight were close to the end of its life.

Therefore, modern flashlights designed either for consumers or for emergency services do not include a battery life indicator.

Products for both categories of use seem to run out of power when they're most needed, especially in emergency situations. There exists no mechanism by which a police officer, for example, can glance at a tactical flashlight and see in a moment the remaining life in the existing battery pack. And in an emergency, replacing batteries—even if spares are carried—is time consuming and sometimes not even possible.

While many of the prior art flashlight battery status measurement and display solutions may be suitable to one degree or another for the particular limited requirements they address, they are not optimum or generalized solutions for today's consumer flashlight products because those solutions are too costly to implement at the consumer level, and the consumer market is price-driven. Such battery status measurement and display solutions may be suitable to flashlights designed for emergency uses, but only if those flashlights employ carbon-zinc, alkaline, or lead-acid batteries, the output voltage of which under load correlate roughly with remaining capacity.

In these respects, the FLASHLIGHT BATTERY LIFE INDICATOR, according to the present invention, substantially departs from the concepts and designs of prior art. In so doing, the present invention provides unique advantages to certain consumer flashlights because it is economical to implement, and unique advantages to flashlights designed for emergency, law enforcement, and military usage, because it provides the user with a constant always-on display of remaining battery life in minutes.

In view of the foregoing disadvantages inherent in common flashlights, and the known methods and practices for the measurement and display of battery life in flashlights, the present invention provides a substantial divergence from custom to achieve the primary goal of providing a method by which a flashlight's remaining battery life can be constantly displayed, in the most useful format: minutes.

The main objective of the present invention is to provide a cost-effective battery life indicator for flashlights that employ batteries and/or regulated supplies with a relatively flat depletion curve.

Another objective is to provide a simple method by which a known depletion period (runtime) of a selected design or combination of components (bulb plus battery pack) can be built into the product.

Another objective is to provide a circuit by which the absence/presence (therefore replacement) of the battery pack can be sensed, triggering a reset to the preset runtime figure.

Another objective is to provide a means by which the preset runtime period can be manually adjusted by the user, based upon experience or knowledge, thus improving the accuracy of the display.

Another objective is to provide an optional nonvolatile memory, such that previous adjustments are "remembered" from one battery change to another.

Another objective is to provide an optional internal/integrated long-life battery, such that selected circuitry comprising the present invention can be self-powered, and memory components thereof can "remember" previous history and runtimes.

Another objective is to provide an always-on display, such that at any time the user can glance at the unit and determine the minutes remaining on the internal battery or charge.

Another objective is to use well-understood and inexpensive countdown timer circuitry, logic, and liquid crystal displays already in wide use, to reduce the cost of implementation of the present invention.

Another objective is to provide the potential to fully exploit the well-understood and inexpensive existing circuitry by embedding a complete (self-powered) timekeeping device in the flashlight, with the countdown feature as but one function thereof.

Another objective is to provide the potential for a simple algorithm that correlates power used with time on, with the understanding that duty cycle has an effect upon the total output minutes (runtime) of many battery types.

Another objective is to provide the potential for a means by which different power levels, selectable by the user, can be accommodated by the circuitry embodying the present invention.

It is the intention of the inventor that these objects apply to flashlight/cell combinations in which a display of either accumulated or remaining runtime is based upon a known value to which runtime on a given set of cells or charge is compared. They are specifically applicable to all flashlight and cell configurations involving an electromechanical mechanism by which a battery supply with a relatively flat depletion curve and therefore a predictable life under load (as with lithium-ion or any supply that is regulated) can be correlated with time used and therefore time remaining, and the result is displayed in a manner convenient to the user.

It is also the intention of the inventor that these objects apply to other battery-operated devices the users of which would benefit from a display of minutes remaining or percentage of battery remaining.

Other objects and advantages of the present invention will become obvious to the reader and it is intended that these objects and advantages be within the scope of the present invention.

To the accomplishment of the above and related objects, this invention may be embodied in the forms illustrated in the accompanying specification and drawings. However, the specification and drawings are illustrative of the basic concepts only, there are many possible configurations and derivatives lying within the intended scope of the invention.

SUMMARY OF THE INVENTION

The present invention is a Flashlight Battery Life Indicator (FBLI) suitable for use in flashlights that employ batteries or cells with relatively flat depletion curves. Alkaline, carbon-zinc, and lead-acid batteries have a gradual depletion curve over time and therefore require a load vs. voltage measurement upon which battery life can be estimated, but nickel metal hydride and especially lithium ion batteries, and all supplies with active regulation, have a depletion curve that approximates a straight line until the battery is about to fail, after which point failure is rapid. The time between "fresh" and the "knee" of the depletion curve is a reliable predictor of runtime of such high-tech batteries and cells.

The FBLI therefore exploits that time vs. load relationship of such batteries, tracking the ON time of the flashlight, correlating time with load, and displaying time remaining in minutes.

In one form, the FBLI consists of a digital countdown timer powered by the flashlight circuit, with a latch that holds the last point at which it was activated. Therefore, when the flashlight is ON the timer is counting down from some preset number that reflects the capacity, in minutes, of the selected battery type. When the flashlight is turned OFF, the timer stops counting but remembers its last setting and the next time the flashlight is turned ON it counts down from that point. The datum reflecting minutes remaining is displayed on an always-on liquid crystal display (LCD) embedded in a shallow milled or molded cavity in the flashlight, with internal wiring to the battery power supply. That LCD and its associated circuitry is anticipated to have about the same power dissipation as the similar circuitry of an inexpensive digital wristwatch, which usually runs from a "button" cell for years. Therefore, the load imposed by the circuitry upon the flashlight battery is considered insignificant.

Some battery/load combinations will provide different run times depending upon duty cycle. That is, the total run minutes will be greater when the duty cycle is no more than (as an example) 25%, which reduces heating of the battery due to internal resistance, and heat suggests loss of energy to thermal radiation rather than light radiation. Also, some flashlights provide more than one power setting. The FBLI circuit can be made intelligent, such that it can either adapt, or be made to adapt, to duty cycle differences. Also, by providing wiring to the same control that determines power settings, internal logic will "know" the current flow and runtime can be predicted accordingly.

When the flashlight is opened to permit replacement of the cells, power is completely removed and the FBLI resets to the original (preset) runtime value. Control is provided by which the user can modify the runtime value, based upon experience (past usage or shared information) or knowledge (change of battery brand or capacity). The present invention includes the potential for nonvolatile memory to "remember" the settings for the previous battery pack(s), minimizing manual adjustments required when batteries of a similar sort are used as replacements.

The flashlight will begin counting down the next time the flashlight is turned ON, presumably with new or freshly charged batteries.

When rechargeable batteries are used, there is potential for the flashlight to be removed from the charger with a partial charge, which would produce a deceptive reading because the FBLI would assume the battery is fully charged. Chargers used with nickel metal hydride batteries, however, are "intelligent" and "know" the charge state of the batteries being charged. Therefore, when the FBLI is implemented in such a rechargeable flashlight, the charger must maintain a constant communication with the flashlight's internal circuit, advising of charge state so in the event the flashlight is removed from the charger prior to attainment of a complete charge, the display will be approximately correct.

A new flashlight equipped with the FBLI, and into which new cells are installed, will display a preset runtime in minutes representing the capacity of the manufacturer-selected battery with the load imposed by the manufacturer-selected bulb. Obviously, different combinations of cell brand/quality and load will perform differently. Therefore, the FBLI includes a control function that permits the user to modify the preset runtime based on experience, measurement, or estimate, and that value can be refined with further experience.

As described, the FBLI can be integrated with newly-manufactured flashlight products as a competitive feature that provides advantages over other flashlight products not similarly equipped.

The FBLI utilizes many of the components of a common digital watch: time base (quartz oscillator), dividers and associated circuitry, some logic, controls, liquid crystal display and driver thereof, and battery, so it is only a matter of adaptation to include all those "watch" functions of which the countdown timer is but one.

The FBLI can also be expressed as an add-on accessory, either as a replacement end-cap (with integrated ON/OFF switch), as a tubular extension that is screwed in place between the original end-cap and the barrel of the flashlight, as a tubular extension that is screwed in place between the original barrel and the emitting end of the flashlight, or as a replacement barrel that fits between the original endcap and the original emitting end.

The best expression of the FBLI utilizes the flashlight's internal battery as a power source. However, it is also possible to embed within the circuit representing the present invention a small (i.e. wrist-watch) battery that will provide years of operation with uninterrupted power. That feature will enable long-term memory and integrated data collection. Also, the use of an internal battery minimizes wiring in those applications where the present invention is an add-on to an existing flashlight.

However expressed, implementation of the FBLI provides the user with a flashlight that displays a reasonable prediction of the time remaining on the batteries in the unit. That prediction is based upon a comparison between actual usage (including compensation for duty cycle) and known/estimated runtime of a given combination of cells and load, with an always-on display of the result, in minutes.

The present invention is equally applicable to other battery-powered devices the users of which would benefit from a display that shows minutes remaining or percent remaining of battery life. Digits displayed can have meanings other than countdown minutes, including countdown or countup watt-minutes, percent, mAh, photons, etc.

The high performance tactical flashlight ordinarily consists of a tubular housing containing one, two, or three lithium-ion cells (typically type CR123) in series, an endcap with integrated switch, and an emitting end with a xenon or high-power LED (Luxeon) light source, an optional regulator, a reflector, lens, and housing. A few examples use a pushbutton switch integrated with the flashlight barrel, and the present invention is easily adapted to that configuration as well, but for simplicity the remainder of this text addresses the most common configuration of such flashlights in which the control is provided in the endcap.

In operation, depressing or twisting the endcap switch completes the circuit, and current flow through the emitter generates light. That current flow depletes the battery at a rate that is predictable for a given set of components and cells.

The present invention consists of two circuits, each grounded, plus one or two control buttons, plus a display showing runtime in minutes. The control buttons are embedded, such that they can be reached only by means of a ball point pen or other implement, and are not readily activated in normal usage. The display is that of a 3-digit liquid crystal display (LCD), behind a durable transparent plastic cover.

Circuit ONE is connected across the full battery of one or more cells, and therefore is "live" whenever the cells are in place. There is no voltage across the circuit when the flashlight is opened and the cell(s) are removed, and voltage appears when the cell(s) is/are replaced and the flashlight closed. That circuit is a very low power, high-impedance circuit that is used as a sensor by which the logic within the present invention resets its countdown timer to a preset value. It is also used to power the countdown timer and liquid crystal display (active and visible at all times), however the timer is "active" and counting only when the second circuit is live.

Circuit TWO is connected to ground and also to the battery end of the emitter (bulb or LED or regulator), such that when the flashlight switch is ON, that circuit becomes "live". The present invention uses that circuit to sense the voltage applied to the emitter of the flashlight, and starts the countdown timer from its previous saved value, transmitting the current value to the driver of the liquid crystal display.

The countdown timer is of the same complexity as that provided in digital wrist watches costing in their entirety, at retail, as little as the equivalent of ten minutes of a union journeyman carpenter's wage. Such a countdown timer is an inexpensive, well-understood, and technically nonchallenging component of the present invention. Many such countdown timer implementations have a pause function, similar to that required by the present invention when the flashlight is OFF, so no new technology is required to achieve that objective.

Either one or two pushbutton (sealed, weatherproof, embedded below the surface of the flashlight housing) switches can be provided to modify the starting runtime and (potentially) other factors. If one switch is used, it can increment the initial runtime value (preset at the factory for nominal battery/cells/load). Obviously, experience may dictate that the correct setting is lower than the factory preset value, in which case the switch may be used to increment past zero to the correct value. Alternatively, a second switch can be added to decrement the displayed value. Alternatively, a quick push-release of a single button can shift the function from UP to DOWN.

It is well understood that the runtime of a given combination of emitter/load and battery/cells will vary with duty cycle. It is a technically trivial exercise to include logic within the present invention sufficiently complex as to accommodate and adjust for that difference, by weighting various ON periods and decrementing runtime accordingly.

It is also possible that the adjustment for runtime made on the previous battery will be retained in nonvolatile memory, so each subsequent adjustment is a refinement.

Therefore, when a flashlight equipped with the present invention is opened for a battery change, circuit ONE is depowered regardless of switch position. When batteries are replaced and the flashlight reassembled, the present invention's logic resets the countdown timer to the preset nominal value or (if nonvolatile memory is provided in the implementation) the retained previous value, which can then be adjusted if required by pushing the appropriate button.

Then, when the flashlight is turned ON, the countdown timer counts down. It stops when the flashlight is turned OFF, but continues to display the remaining runtime value. Therefore, whenever the flashlight is picked up, a glance is sufficient to tell the user the number of minutes remaining on the present cells or charge.

One derivative of the present invention permits detection and adjustment of runtime based upon whether the flashlight is kept ON for an extended period, or is ON and OFF for various duty cycles.

There is also the possibility of such additional features as fiber-optic or other illumination of the runtime display, or inclusion of a dim (for tactical reasons) LED warning when runtime approaches some preset limit.

The present invention can be incorporated in a newly-manufactured flashlight, or can be built as an accessory or replacement component of existing flashlights. When built as an accessory, additional wiring or circuitry may be required to avoid loss of functionality. For example, if the accessory is at the switch end of the flashlight, some means must be provided for sensing voltage at the base of the emitter. To avoid such complexity, some derivatives may include independent power supplies, such as a watch battery.

Other functions and derivatives of these functions are also possible, and if a flashlight battery life indicator is based upon (1) the relatively linear runtime of modern batteries as opposed to voltage measurement under load, and (2) countdown of remaining runtime when the flashlight is ON, such battery life indicators are considered within the scope of the present invention.

BRIEF DESCRIPTION OF THE SEVERAL VIEWS OF THE DRAWINGS

FIG. 2 is a simple drawing and block diagram of a typical high-performance flashlight consisting of a barrel (1) containing two lithium-ion CR123 3V cells (2), a removable end cap (3) with an integrated push-to-make switch (4), a xenon bulb or other emitter (5), a reflector (6), and a threaded housing and cover containing a lens (7).

FIG. 3 is a diagram of the present invention, showing a common (as in inexpensive digital timers and wrist-watches) countdown timer circuit with optional logic/memory (8), voltage reference (9), power connection (10), power connection (11) integrated quartz oscillator reference (12), display (13), and control button(s) (14). (17) shows an abbreviated symbol for the same diagram.

DETAILED DESCRIPTION OF THE INVENTION

Figure 1:
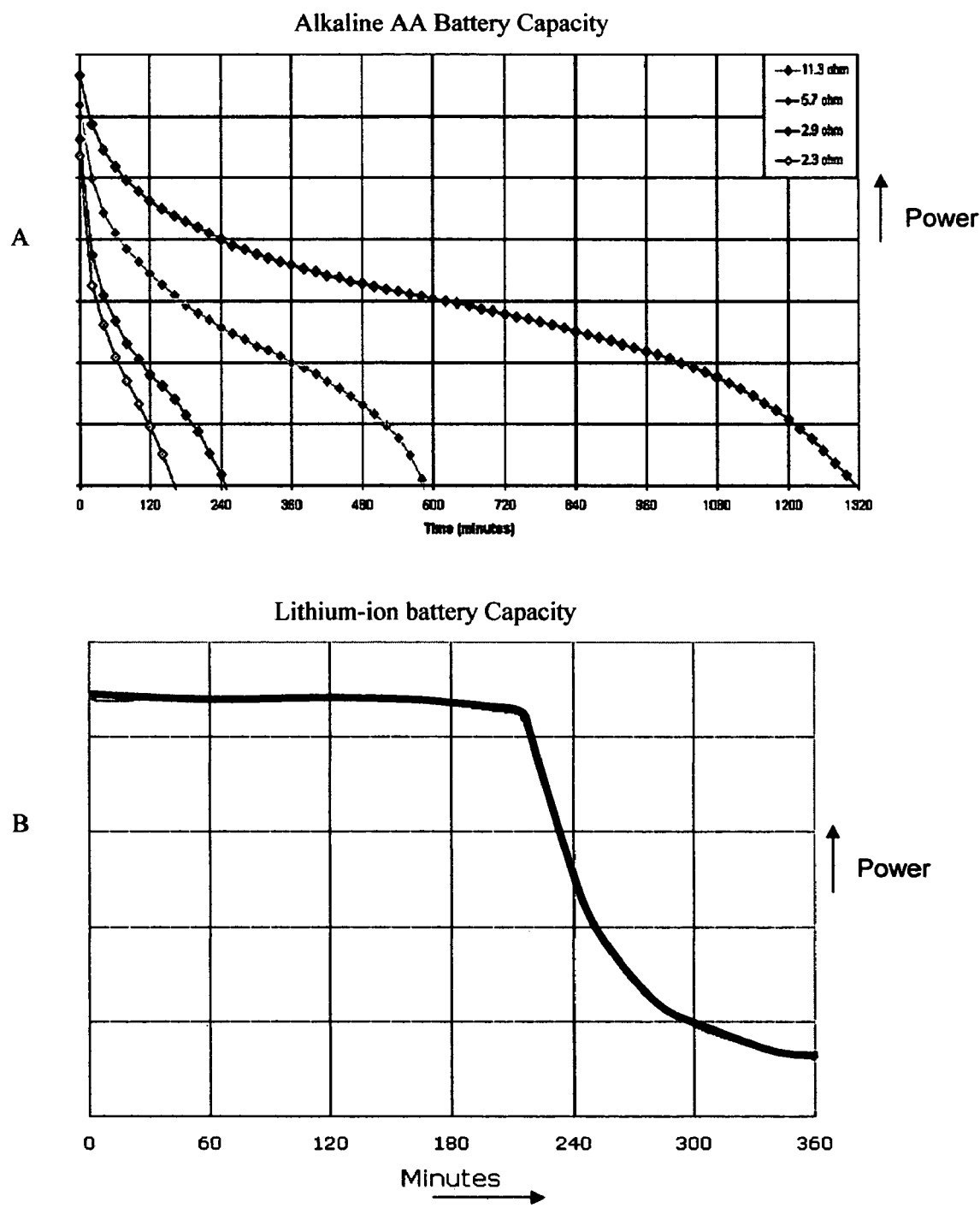
FIG. 1 depicts the depletion curves of two different battery types. In 1A, the alkaline batteries lose capacity gradually, making it difficult to identify a point at which such a battery is no longer effective. In 1B, the lithium-ion batteries—either direct or regulated—maintain a relatively constant output until chemical energy is virtually all converted to electrical output, and then output plummets. It is this linear depletion characteristic, which is a relatively new feature available from recent-technology batteries, that is exploited by the present invention.
Figure 4:
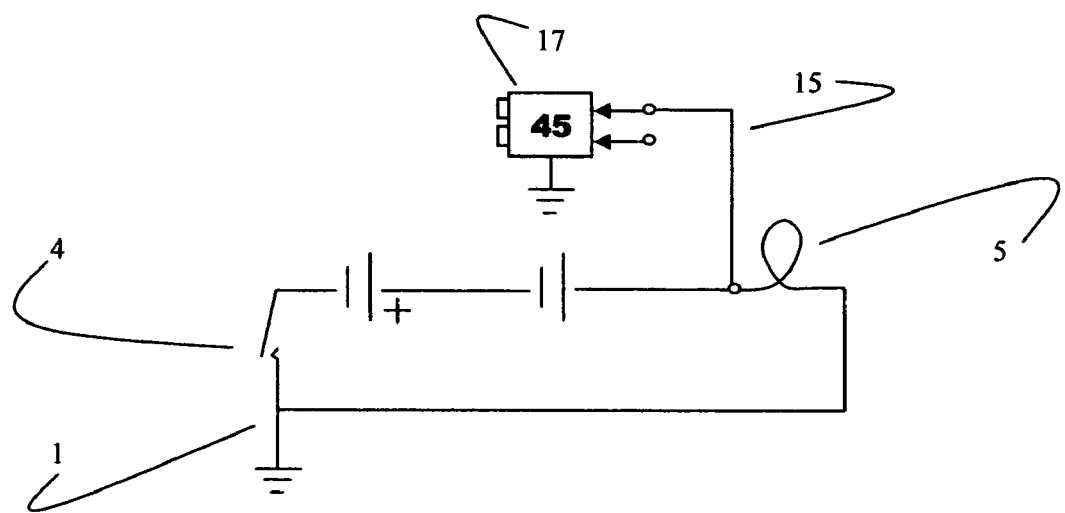
FIG. 4 shows the simplest method by which function provided by the present invention can be added to a flashlight design. The module represented by (17) is added such that when the switch (4) is closed to power the emitter (5), the voltage of the cell(s) also appears between the connection (15) and ground (1), thus triggering countdown. In this expression of the design, there must be nonvolatile memory or a long-life battery integrated with the circuit to provide continuity from one usage of the flashlight to the next. Also, this design requires a RESET function when cells are replaced.
Figure 5:
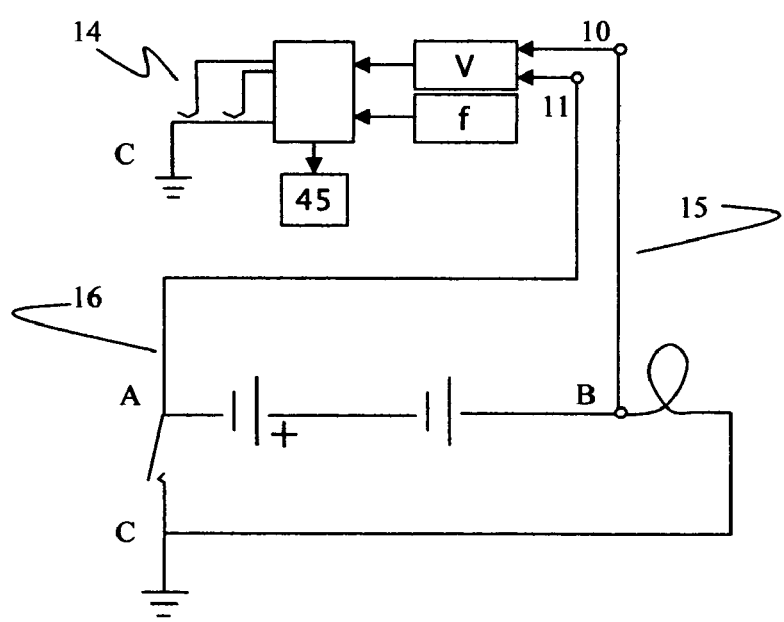
FIG. 5 utilizes the flashlight cell(s) to power the circuit of the present invention, which eliminates the need for nonvolatile memory (for the basic function), and permits automatic triggering of the RESET function when cells are replaced. That power to the system is always present when batteries are installed, due to connections A and B and circuits (15) and (16). Both the original circuit and the new circuits are grounded through the barrel (1) of the flashlight, shown as C. Connection (15) is connected at point B such that the new circuit senses voltage between that point and ground C only when the flashlight is switched ON, which triggers the countdown. When the batteries are removed completely and no voltage appears between A and B, the system automatically resets to the predetermined runtime (adjustable subsequently with the control(s) (14).
Figure 6:
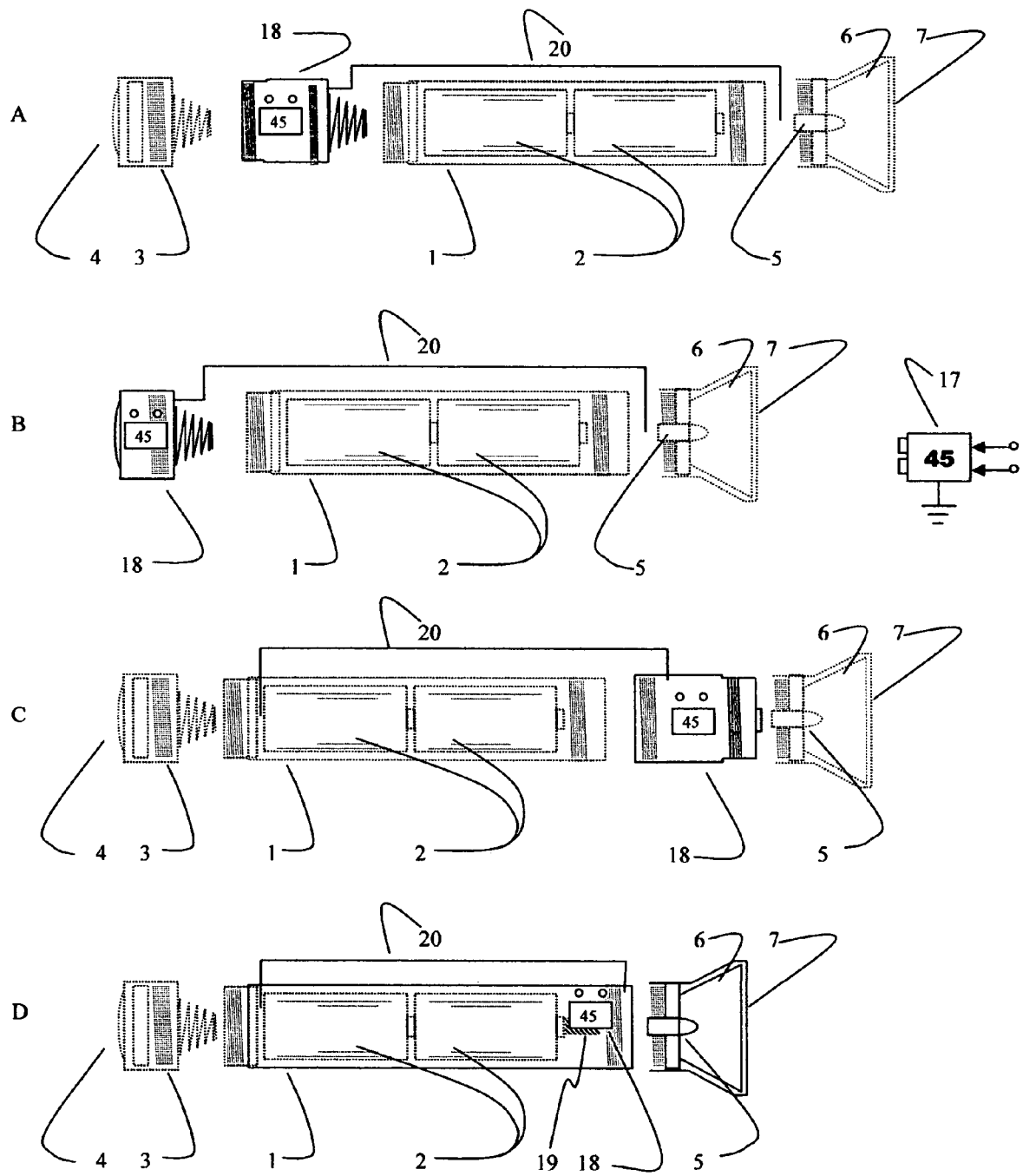
FIG. 6 reflects derivatives of the present invention as an add-on accessory (18), in which variations of (17) can be expressed as an add-on unit between the end cap (3) and the barrel (1), as in 5A. It can also be expressed as a replacement end-cap, as in 5B. It can also be expressed as an add-on accessory between the barrel and the light/reflector assembly (5-7), as in 5C. Finally, it can be expressed as a replacement barrel, with the new functionality built into some point of the new barrel, as in 5D, with an extension spring (19) to make the connection between the cells and the emitter base. Depending on desired functionality, some add-on configurations will require some combination of extra wiring (20) and/or nonvolatile memory and/or independent battery ("button" cells, as in wrist-watches) supplies.
Figure 7:
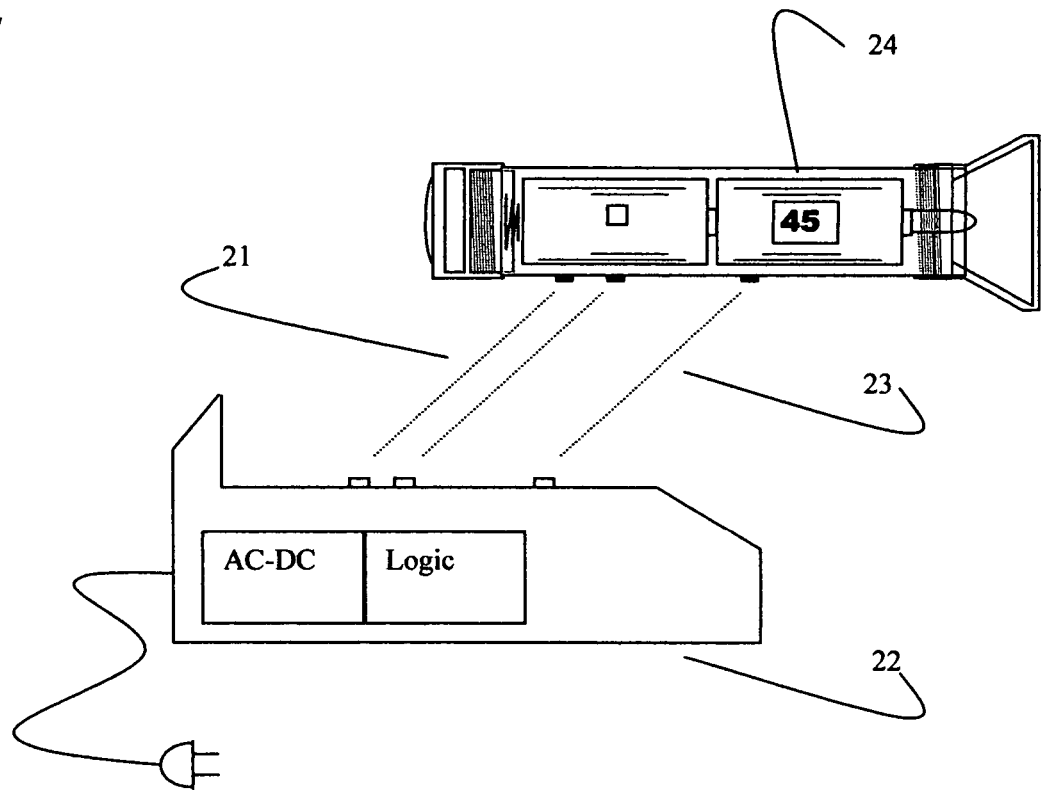
FIG. 7 reflects connections (21) between the present invention (17) integrated into a flashlight using rechargeable cells and a charger (22). A separate data path is provided (23) or a non-DC signal is superimposed (24) on the charge circuit to inform the FBLI of the state of charge, as reported by the charger (22), so that premature removal (before 100% charge is attained) will still permit accurate runtime display of the FBLI.
Figure 7:
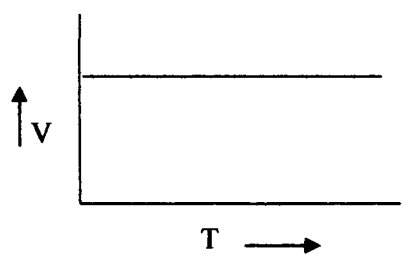
Figure 7:
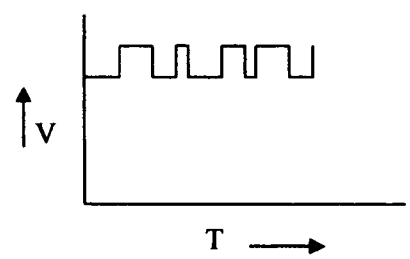

Preferred embodiment of the present invention will be described in detail below with reference to the accompanying drawings.

The preferred embodiment of the present invention, the Flashlight Battery Life Indicator (FBLI), is also the simplest expression thereof, in which it is deployed as a runtime display in a newly manufactured flashlight intended for emergency services or military personnel, etc. Such flashlights are often utilized by other emergency services personnel, and are even purchased by consumers. Such a flashlight is typically powered by two 3V CR123 lithium-ion batteries overdriving a 4.8V xenon bulb, all in a cylindrical package measuring about five inches in length and about 1.125" in diameter. These "miniature tactical flashlights" often generate about 100 lumens output (sufficient to temporarily blind a human).

The preferred embodiment flashlight is equipped with a push-ON momentary switch at its base, the collar of which may sometimes be rotatable for permanent ON/OFF.

The FBLI consists of a simple liquid crystal display, one IC, one crystal oscillator clock circuit, and one or two simple pushbuttons, all with about the same complexity as ordinarily appears in an inexpensive plastic digital wrist watch, with no independent battery as the system is powered by the flashlight's battery. Drain, however, is about that of a wrist watch so the net effect upon battery life is negligible.

In the preferred embodiment, the power to the base of the light bulb appears at the FBLI as a "sense" signal to turn the countdown timer ON and OFF.

In the preferred embodiment, the flashlight's battery is also wired to the FBLI to power it whether the light is ON or OFF, thus providing memory from one ON event to another.

In the preferred embodiment, the FBLI assembly is fitted into a shallow milled cavity in a suitable component of the flashlight, and capped with a sealed plastic cover through which the display may be easily read. Adjacent embedded waterproof buttons are provided to permit access to the switches that control the circuit.

When batteries are in place, the user can use a ballpen or similar implement to activate the switches provided to make setting changes. There are many possible control scenarios, but in the preferred embodiment, pressing and holding one of them puts the FBLI into a settings mode, in which the other button can be cycled through user-determined values. At that point, the user can set or modify the projected runtime of the batteries selected for the flashlight. For example, the Surefire batteries in a specific model of Surefire flashlight produce a known runtime value, which can be preset at the factory, and then modified by the user when a different brand of batteries is selected.

In the preferred embodiment, when new batteries are installed and the flashlight is closed, the FBLI is powered and initialized, and the LCD will display the preset runtime value for that flashlight. The user can then modify the runtime remaining, based on published battery/bulb information or on experience. From that time on, the FBLI will display runtime remaining, depending upon the time the flashlight has been ON. Every time the flashlight power is switched ON the timer circuit counts down from its initial preset value, so at any given moment it displays runtime remaining. The displayed data is visible whether the flashlight is ON or OFF, so if the flashlight is picked up in an emergency situation, the user can determine battery condition at a glance.

The preferred embodiment is also the simplest form of the present invention. The basic FBLI can be augmented with such features as accommodation of different power levels, an algorithm to adjust for duty cycle, communication with a charger (for rechargeable batteries), etc.

Various other objects, features and attendant advantages of the present invention will become evident as the reader follows that flow and considers obvious alternatives and derivatives of the flow shown, all of which are the intention of the inventor as embraced by the present invention.

I claim:

1. A battery operated device with a battery life indicator comprising a housing, at least one cell located inside said housing, a two-position mechanical switch, an emitting unit and a battery life indicator, wherein:
   (i) said battery, said mechanical switch and said emitting unit are electrically connected to form a primary circuit and assembled with said housing;
   (ii) said mechanical switch completes said primary circuit when switched to the first position and interrupts said primary circuit while switched to the second position, thus said emitting unit operates by action of said mechanical switch;
   (iii) said battery life indicator is comprised of a countdown timer, at least one embedded control button and a liquid crystal display, thus forming a secondary circuit;
   (iv) said secondary circuit is connected with said primary circuit in parallel with common ground, thus said secondary circuit is always powered;
   (v) said control button provides a signal to said countdown timer for establishment of an initial runtime value of said battery;
   (vi) said liquid crystal display is operated by said countdown timer and shows remaining runtime value of said battery starting from the initial runtime value;
   (vii) said secondary circuit uses an electrical signal derived from said primary circuit to operate said countdown timer;
   (viii) said countdown timer operates in such a way that, when said primary circuit is interrupted by said mechanical switch, said countdown timer is stopped and current runtime value shown by said liquid crystal display is fixed, while when said primary circuit is completed by said mechanical switch, said countdown timer continues to operate and said liquid crystal display shows current runtime value counting down from the previously fixed runtime value.

2. The device as claimed in claim 1, wherein said cell is a lithium-ion cell.

3. The device as claimed in claim 1, wherein said cell is a nickel metal hydride cell.

4. The device as claimed in claim 1, wherein said cell is a rechargeable cell.

5. The device as claimed in claim 4, wherein said device further includes a charger unit with a data path and a logic unit.

6. The device as claimed in claim 5, wherein said data path is connected to said countdown timer when said device is installed on said charger, thus said logic unit provides correlation between current runtime value shown by said liquid crystal display and a charge percentage of said rechargeable cell.

7. The device as claimed in claim 1, wherein said primary circuit further includes a regulator for control of emitting intensity of said device.

8. The device as claimed in claim 1, wherein said secondary circuit further includes an auxiliary power source, thus said liquid crystal display shows remaining runtime value when said primary circuit is open.

9. The device as claimed in claim 1, wherein said emitting unit comprises of a reflector, a lens and at least one light source, thus said device serves as a flashlight.

10. The device as claimed in claim 9, wherein said housing is made as an open tube assembled with one end being said mechanical switch made as an endcap, while other end assembled as said emitting unit.

11. The device as claimed in claim 9, wherein said light source is a xenon bulb.

12. The device as claimed in claim 9, wherein said light source is a light emitting diode.

13. The device as claimed in claim 10, wherein said battery life indicator is mounted between said open tube and said endcap.

14. The device as claimed in claim 10, wherein said battery life indicator is integrated with said endcap.

15. The device as claimed in claim 10, wherein said battery life indicator is mounted between said open tube and said emitting unit.

16. The device as claimed in claim 10, wherein said battery life indicator is integrated with said open tube.

17. The device as claimed in claim 1, wherein said runtime value is expressed as time or power units, used or remaining.

* * * * *